United States Patent [19]

Chason et al.

[11] Patent Number: 5,248,851

[45] Date of Patent: Sep. 28, 1993

[54] PSEUDO-ROD FABRICATED FROM DISCRETE PLANAR CONDUCTORS

[75] Inventors: Marc K. Chason; Richard S. Kommrusch, both of Schaumburg; Pankaj B. Desai, Hoffman Estates, all of Ill.

[73] Assignee: Motorola, Inc., Schaumburg, Ill.

[21] Appl. No.: 985,247

[22] Filed: Dec. 2, 1992

Related U.S. Application Data

[63] Continuation of Ser. No. 633,706, Dec. 21, 1990, abandoned.

[51] Int. Cl.$^5$ .................. H01B 12/00; H01B 5/08
[52] U.S. Cl. .................. 174/125.1; 174/129 R; 505/1; 505/704; 505/884; 505/886; 505/887
[58] Field of Search ............ 174/15.4, 15.5, 125.1, 174/129 R; 505/1, 704, 884, 885, 886, 887

[56] References Cited

U.S. PATENT DOCUMENTS

| | | | |
|---|---|---|---|
| 4,377,905 | 3/1983 | Agatsuma et al. | 29/599 |
| 4,863,804 | 9/1989 | Whitlow et al. | 428/555 |
| 4,921,833 | 5/1990 | Takano | 505/1 |
| 4,927,985 | 5/1990 | Iyer et al. | 174/125.1 |
| 4,980,964 | 1/1991 | Boeke | 29/599 |
| 4,983,574 | 1/1991 | Meyer | 505/1 |
| 5,114,908 | 5/1992 | Sato et al. | 505/1 |

FOREIGN PATENT DOCUMENTS

| | | | |
|---|---|---|---|
| 1463138 | 12/1966 | France | 174/125.1 |
| 13911 | 1/1989 | Japan | 174/15.5 |

Primary Examiner—Leo P. Picard
Assistant Examiner—Bot Ledynh
Attorney, Agent, or Firm—Joseph P. Krause

[57] ABSTRACT

A pseudo rod, fabricated from several plate sections joined together at their edges and having a cross-section resembling a polygon approximates a rod having a circular cross section. Using multiple plates joined at their edges permits growing a crystalline material on the planar faced substrates and if the plates are crystalline material, the crystalline material grown thereon can have improved current carrying capability.

12 Claims, 1 Drawing Sheet

PSEUDO-ROD FABRICATED FROM DISCRETE PLANAR CONDUCTORS

This is a continuation of application Ser. No. 07/633,706, filed Dec. 21, 1990 and now abandoned.

FIELD OF THE INVENTION

This invention relates to conductors. In particular, this invention relates to substrates or carriers for crystalline conductive materials, including high temperature crystalline superconducting materials, that might require a specific substrate crystal orientation to maximize superconductivity.

BACKGROUND OF THE INVENTION

Superconducting materials are well known in the art. Niobium based superconductive materials for example, which require extremely low temperatures, have been used for years for superconducting wire used in electromagnets for particle accelerators.

New, relatively high temperature superconducting materials, including, for example, yttrium-barium-copper-oxide (YBC) and bismuth based and thalium based copper oxide materials may be more practical in many applications where the extremely low temperatures required for niobium based superconductors may not be feasible. (YBC and the others are relatively new crystalline materials that superconduct at temperatures near the temperature of liquid nitrogen.) A problem with high temperature crystalline superconducting materials, including YBC, is that to obtain maximum current density, Jc, when the material is below its critical temperature, $T_c$, i.e. superconducting, the crystalline superconducting material should be grown on a crystalline surface. Moreover, the crystalline structure of both the substrate and the crystalline superconductor should align with respect to each other. Stated alternatively, when the crystalline structure orientation of a crystalline superconductor differs from the crystal orientation of a substrate supporting the superconductor, the superconducting current density will decrease with increasing crystal orientation deviation between the two crystalline structures. This is so for materials that are anisotropic. (Anisotropic superconductive materials are those in which the critical current density, $J_c$, can change significantly with crystal orientation.)

It is noteworthy that some niobium-based superconductors do not experience a significant decrease in Jc as the crystal orientation of a substrate changes with respect to the crystal orientation of the superconductor because these superconductors are isotropic crystalline materials. (An isotropic superconductor is one in which the critical current density, $J_c$, does not change significantly with crystal orientation.) Other conductive crystalline materials however that are grown on a crystalline substrate, including even those that are not superconducting, might suffer a decrease in conductivity or current density Jc when the crystal orientation of the substrate differs with respect to the orientation of the material. A substrate that minimizes conductor/substrate crystalline misalignment might improve Jc for crystalline conductors, particularly crystalline superconductors. Since most conductors that carry current have cross-sectional shapes that are either circular or nearly circular, a substrate having a circular cross section that improves alignment between a crystal structure of the conductive material and the substrate would be an improvement over the prior art.

Many practical applications for conductors require or operate better using a conductive material shaped as a rod (resonators in a microwave cavity filter for example). If a crystalline conductive material must be grown on a rod-shaped crystalline substrate, (such a rod being a single crystal) the crystal orientation of the rod material will orient the crystal structure of the conductor at substantially two regions, opposite each other (separated by 180 degrees) on the surface of the rod. The maximum current density per unit area will exist in only those two regions where the single crystal rod orients the crystalline structure of the superconducting material. The surface of a rod fabricated from a single crystal will have a crystal orientation varying around the circumference of the rod.

Since the optimum geometry for a crystalline substrate on which crystalline superconducting materials is grown is a plane, maintaining near perfect alignment between the substrate structure and the conductive material structure becomes very difficult when a circular cross-sectioned conductor is required. An electrical conductor that has a relatively circular, or near circular cross-section, similar to the cross-section of a wire, cable, or pipe but which has an improved substrate crystal orientation enhancing the current density capability of a crystal and superconductor would be an improvement over the prior art.

SUMMARY OF THE INVENTION

There is provided an electrical conductor comprised of multiple planar substrates upon each of which can be grown a crystalline material. (Each planar substrate, which might be either conductive or non-conductive, has at least one conductive layer on one surface of the planar substrate.) The multiple planar substrates, each having some predetermined linear length are attached at their sides to form a length of a pseudo rod, the cross-section of which is preferably a closed, regular polygon. As the number of these substrate sections joined together increases, the cross-sectional shape of the pseudo rod they form begins to approximate the cross-section of a cylinder. (In the limit, as the number of these sections increases to infinity, the cross-section of a rod formed by such a number of these planar sections joined together at their sides and forming a closed regular polygon, is a circle.) A crystalline material grown on a plane crystalline surface can have its crystalline orientation uniformly matching the crystal orientation everywhere on the substrate.

In one embodiment of the invention several planar strips of crystalline substrate material are coupled at the edges to other planar strips, each planar strip coupled to an adjacent strip at such an angle that six or more of these planar strips are arranged to form a hexagon or other regular polygon cross-sectioned rod. Crystalline orientation of the material on the substrates is determined by the orientation of the substrates.

In this first embodiment the planar substrates are physically (or mechanically) coupled together, each on two sides but with no electrical contact existing between the layers of superconducting material on the surfaces of the substrates. In at least one alternate embodiment the edges of the planar substrates to which other planar substrates are joined are mitred at an angle such that the planar substrates can be physically coupled and the superconducting material on the surfaces of the substrates are electrically coupled as well.

DESCRIPTION OF A PREFERRED EMBODIMENT

Figure 1:
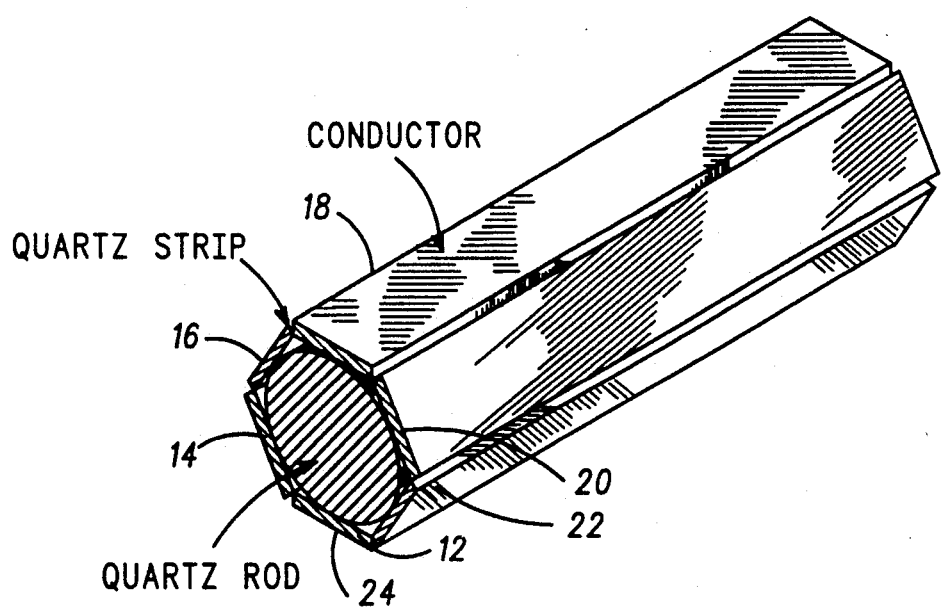
FIG. 1 shows an isometric view of a pseudo-rod comprised of discrete planar conductors coupled together to form a rod having a cross-section resembling a closed regular polygon.

FIG. 1 shows an isometric view of an electrical conductor pseudo rod (10) comprised of a plurality of substantially planar substrates (12, 14, 16, 18, 20, and 22) joined together at their edges and at one or more predetermined angles with respect to each other so that the cross section of the pseudo rod (10) forms a closed regular polygon. In the preferred embodiment the substrates (12, 14, 16, 18, 20, and 22) are relatively thin sheets or slabs of crystalline material upon which a crystalline material, such as a crystalline superconducting material, may be grown. (As mentioned above, since most niobium based superconductors do not experience a decrease in Jc with differences between the crystal orientation of the substrate and the superconductor, the superconducting material grown on the surface of these planar substrates (12-22) will most likely be YBC-based or other crystalline materials.)

Since YBC based materials typically grow on crystalline substrates, the materials chosen for the substrates (12-22) are preferably crystalline substrate materials such as magnesium oxide, (MgO), lanthanum aluminate, ($LaAlO_3$), etc.

In the embodiment shown in FIG. 1 a quartz rod (24) having a circular cross section extends through the length of the pseudo rod (10) and functions as a structural support for the substrates (12, 14, 16, 18, 20, and 22) by mounting the substrates (12, 14, 16, 18, 20, and 22) to the surface of the rod (24). Fused quartz, which is an amorphous silicon dioxide, was chosen for the preferred embodiment because of its low thermal expansion coefficient and its low dielectric loss.

Figure 2:
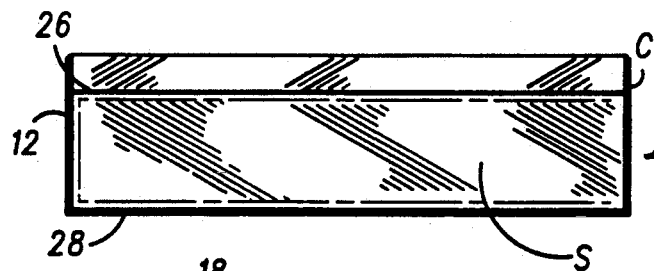
FIG. 2 shows a cross-section of a planar conductor shown in FIG. 1.
Figure 3:
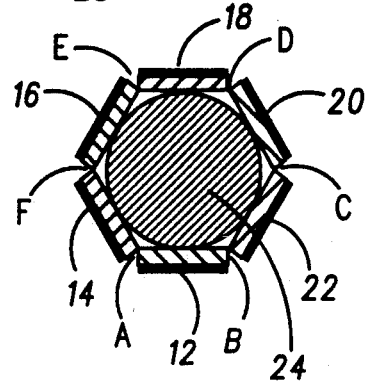
FIG. 3 shows the cross-sectional view of the structure shown in FIG. 1.

FIG. 2 shows a cross sectional view of one of the substrates (12) shown in FIGS. 1 and 3. A substrate layer, (S) preferably having a crystalline structure allowing the growing of a crystalline conductive or superconductive layer of material (C) has a substantially rectangular cross section. The substrate shown in FIG. 2, as well as all the other substrates shown in FIGS. 1, 3, and 4, have at least one surface (26) upon which the conductive material is deposited. (Surface 26 is referred to hereafter as the upper surface for brevity.) Another surface, 28, (referred to hereafter as the lower surface) will typically have no material deposited onto it. Some other embodiments of the structure shown in the figures might employ conductive material on both surfaces 26 and 28 or other surfaces as well. (Other embodiments of the substrates might employ a first, non-crystalline supporting layer, fused quartz for example, upon which a second crystalline, non-superconducting substrate layer is deposited. A third layer, being a crystalline conductive material might then be grown on the crystalline substrate layer.)

FIG. 3 shows a side elevation of the pseudo rod (10) shown in FIG. 1 constructed from substrates similar to that shown in FIG. 2. The substrates (12-22) shown in FIG. 1 and 2 each have substantially rectangular cross-sections, are joined at each side (points A through F) and, as shown, at an angle theta with respect to each other, such that the substrates enclose a volume having a six-sided regular polygon cross-section. In the embodiment shown in FIG. 3, the substrates (12-22) are of substantially equal size and width and when joined together subtend a 360 degree arc enclosing a volume having a hexagon-shaped cross section. Obviously, alternate embodiments would include triangular, rectangular, or pentagonal shapes for the cross section of the pseudo rod (10) or higher order polygons.

Because the substrates (12, 14, 16, 18, 20, and 22) in the embodiment shown in FIG. 3, have rectangular cross-sections (as shown in FIG. 2, the regions near the upper surfaces (26) and between physically adjacent substrates (the interstitial regions), are open such that the conductive material layer (C) on the upper surfaces do not electrically contact each other. The substrates are held together in close mechanical contact with adjacent substrates by any appropriate method or apparatus including an adhesive for example. Alternatively, the substrates may be held in mechanical contact with each other at their intersection points (A-F) merely by bonding each substrate (12, 14, 16, 18, 20, and 22) to the center quartz rod (24).

Figure 4:
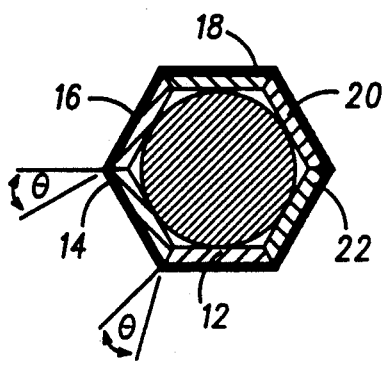
FIG. 4 shows a cross-sectional view of an alternate embodiment of the apparatus shown in FIG. 3.

FIG. 4 shows an alternate embodiment of the electrical conducting rod (10) shown in FIG. 1. In FIG. 4, the substrates (12-22) have both joined edges of the substrates (12, 14, 16, 18, 20, and 22) mitred at an angle theta which permits the substrates to more closely fit together and thereby facilitates the superconducting materials grown on the upper surfaces of the substrates to electrically and physically contact superconducting layers of materials on adjacent substrates.

Referring to substrate (14) for example, it has its edges mitred at an angle theta with respect to a normal to the surface of the substrate (14) such that when five other identically edge mitred substrates are coupled together the layers of superconducting material on the substrates physically contacts the layer on an adjacent substrate.

In the preferred embodiment the substrate material was lanthanum aluminate, ($LaAlO_3$).

The material deposited on to the outer surfaces of the substrates is preferably a superconductor, YBC, thalium-based or bismuth-based copper oxides, for example, although other non-superconducting but crystalline materials may work as well. (Thalium-based and bismuth-based superconductors include families of materials, the exact chemical composition of which can be found in the literature.) Organic conductive materials might also be used as conductive material deposited onto the substrates.

While the embodiments shown in FIGS. 1-3 show only one side of a planar substrate having material deposited on to it, alternate embodiments might include depositing material on both upper and lower sides of the substrates as well.

In fabricating the pseudo-rod (10) shown in the FIGS., the salient steps are the deposition of the superconducting material or the other material on to at least one surface of the planar substrates (12-22). After having deposited the conductive material on to the substrates, they are mechanically coupled together using an adhesive or other means of coupling the planar substrates in an arrangement that preferably approximates a circular cross-section of the rod.

Alternate methodologies might include the formation of the rod by assembling the planar substrates together and thereafter growing the conductive material on the planar surfaces of the assembled rod.

If superconducting materials such as those described above can be grown, fabricated, or otherwise shaped into slabs of the shape of the substrates described above, another alternate embodiment would include assembling a rod from such slabs. Slabs of superconductor joined at their edges to form a rod having a cross-section that resembles a closed polygon might be able to use alternate fabrication techniques for superconductors.

What is claimed is:

1. An electrical conductor comprised of a plurality of substantially planar dielectric quartz crystalline substrates each dielectric quartz crystalline substrate having at least first and second sides, each quartz crystalline substrate having at least one layer of an electrically superconducting material on at least one side, each of said quartz crystalline substrates being at least mechanically coupled together and to a substantially circular cross-sectioned and solid quartz crystalline rod to form the sides of a length of electrically conductive polygon cross-sectioned rod.

2. An electrical conductor comprised of a plurality of planar dielectric quartz crystalline substrates having at least first and second sides, each dielectric quartz crystalline substrate having at least one layer of electrically superconducting material on at least one side, each of said quartz crystalline substrates being mechanically coupled together and electrically isolated from each other, and mechanically coupled to a circular cross-sectioned, quartz crystalline rod to form the sides of a length of superconducting polygon cross-sectioned rod.

3. The electrical conductor of claim 2 where the at least one layer of electrically conductive material on at least one side, includes yttrium barium copper oxide material.

4. The electrical conductor of claim 2 where the at least one layer of electrically conductive material on at least one side, includes thalium-based copper oxide material.

5. The electrical conductor of claim 2 where the at least one layer of electrically conductive material on at least one side, includes bismuth-based copper oxide material.

6. The electrical conductor of claim 2 where the at least one layer of electrically conductive material on at least one side, includes niobium-based material.

7. An electrical conductor comprised of a plurality of dielectric quartz crystalline planar substrates having at least first and second sides, each dielectric quartz crystalline planar substrate having at least one layer of electrically conductive material on at least one side, each of said substrates being mechanically and electrically coupled together and to a circular cross-sectioned quartz rod to form the sides of a length of conductive polygon cross-sectioned rod.

8. The electrical conductor of claim 7 where said non-conductive planar substrates is comprised of lanthanum aluminate, ($LaAlO_3$).

9. The electrical conductor of claim 7 where the at least one layer of electrically conductive material on at least one side, includes yttrium barium copper oxide material.

10. The electrical conductor of claim 7 where the at least one layer of electrically conductive material on at least one side, includes thalium-based copper oxide material.

11. The electrical conductor of claim 7 where the at least one layer of electrically conductive material on at least one side, includes bismuth-based copper oxide material.

12. The electrical conductor of claim 7 where the at least one layer of electrically conductive material on at least one side, includes niobium-based material.

* * * * *